United States Patent
Wang et al.

(10) Patent No.: US 8,311,477 B2
(45) Date of Patent: Nov. 13, 2012

(54) HIGH-FREQUENCY SWITCHING CIRCUIT AND RADIO COMMUNICATION DEVICE

(75) Inventors: Tong Wang, Kawasaki (JP); Toshiya Mitomo, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 57 days.

(21) Appl. No.: 13/036,762

(22) Filed: Feb. 28, 2011

(65) Prior Publication Data

US 2012/0064835 A1    Mar. 15, 2012

(30) Foreign Application Priority Data

Sep. 9, 2010  (JP) ................................ 2010-201976

(51) Int. Cl.
  *H04B 5/00*  (2006.01)
(52) U.S. Cl. ............. 455/41.1; 455/73; 455/82; 455/83; 455/78
(58) Field of Classification Search .................... 455/73, 455/82, 83, 41.1, 78
See application file for complete search history.

(56) References Cited

U.S. PATENT DOCUMENTS

| | | | | |
|---|---|---|---|---|
| 6,176,432 B1 * | 1/2001 | Miyaura | ....................... | 235/487 |
| 7,120,399 B2 * | 10/2006 | Khorram | ....................... | 455/121 |
| 2011/0279184 A1 * | 11/2011 | Chan et al. | .................... | 330/295 |

OTHER PUBLICATIONS

Adabi et al.; "A mm-Wave Transformer Based Transmit/Receive Switch in 90nm CMOS Technology", Proceedings of the 39th European Microwave Conference, pp. 389-392, (2009).

* cited by examiner

*Primary Examiner* — Sanh Phu
(74) *Attorney, Agent, or Firm* — Finnegan, Henderson, Farabow, Garrett & Dunner, L.L.P.

(57) ABSTRACT

According to one embodiment of the present invention, there is provided a high-frequency switching circuit including a first differential line and third line. The differential line includes a first line configured to have one end and an other end, a second line configured to have one end and an other end and a first switch configured to switch electrical connection between the one ends of the first and second lines. The differential line receives or outputs differential signals by the other ends of the first and second lines. The third line is configured to be electromagnetically coupled with the first differential line when the first switch is turned on. The first switch is arranged at a position where an electrical length from the other end of the first line and an electrical length from the other end of the second line are approximately equal.

6 Claims, 8 Drawing Sheets

HIGH-FREQUENCY SWITCHING CIRCUIT AND RADIO COMMUNICATION DEVICE

CROSS REFERENCE TO RELATED APPLICATIONS

This application is based upon and claims the benefit of priority from the prior Japanese Patent Application No. 2010-201976, filed on Sep. 9, 2010, the entire contents of which are incorporated herein by reference.

FIELD

The embodiments of the present invention relate to a high-frequency switching circuit for switching the connection between high-frequency circuits, and a radio communication device using the high-frequency switching circuit.

RELATED ART

Background

A conventional high-frequency switching circuit is formed of a plurality of MOS switches (MOS transistors) for switching the connection between circuits, and shunt MOS switches corresponding to the MOS switches, for example. As another example, there is also a high-frequency switching circuit formed of transformers and shunt MOS switches.

When the gate width of the MOS switch is increased, ON resistance is reduced and suitable loss characteristics can be obtained.

However, there is a problem that parasitic capacitance is increased when the gate width is increased. Large parasitic capacitance increases leakage current, which leads to deterioration in operating characteristics. In other words, the MOS switch has a trade-off relationship between the ON resistance and parasitic capacitance.

Further, there is a problem that the high-frequency switching circuit having the above structure is difficult to lay out and increases circuit area when being applied to a radio communication device having a differential structure.

DETAILED DESCRIPTION OF THE INVENTION

According to one embodiment of the present invention, there is provided a high-frequency switching circuit comprising a first differential line and third line.

The differential line includes a first line configured to have one end and an other end, a second line configured to have one end and an other end and a first switch configured to switch electrical connection between the one ends of the first and second lines. The other ends of the first and second lines receives or outputs differential signals.

The third line is configured to be electromagnetically coupled with the first differential line when the first switch is turned on.

The first switch is arranged at a position where an electrical length from the other end of the first line and an electrical length from the other end of the second line are approximately equal.

Hereinafter, first, second, third, fourth, and fifth embodiments will be explained referring to the drawings. Note that components attached with the same number in the drawings similarly operate, and overlapping explanation will be omitted.

First Embodiment

Figure 1:
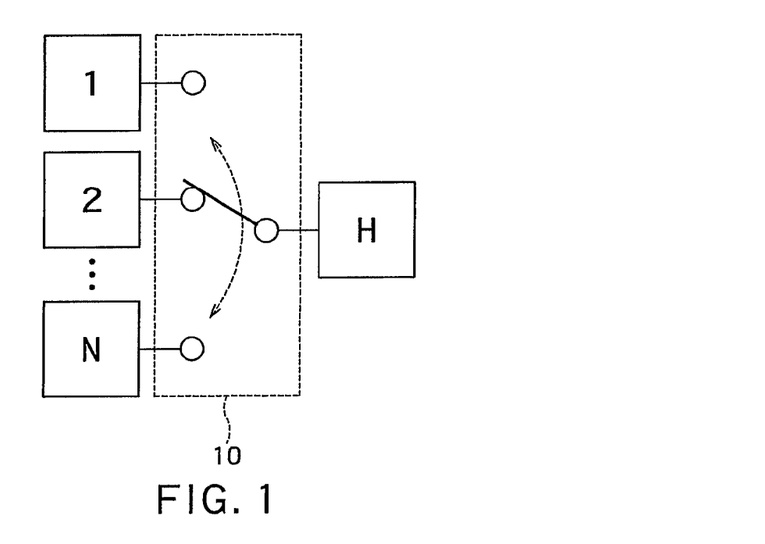
FIG. 1 shows a functional image of a high-frequency switching circuit.

FIG. 1 shows a functional image of a high-frequency switching circuit.

A high-frequency switching circuit 10 switches the connection between a high-frequency circuit H and high-frequency circuits 1, 2, ..., N.

N is an integer of 1 or greater. When N is 1, the high-frequency switching circuit 10 switches the connection and disconnection between two high-frequency circuits (high-frequency circuit H and high-frequency circuit 1).

Figure 2:
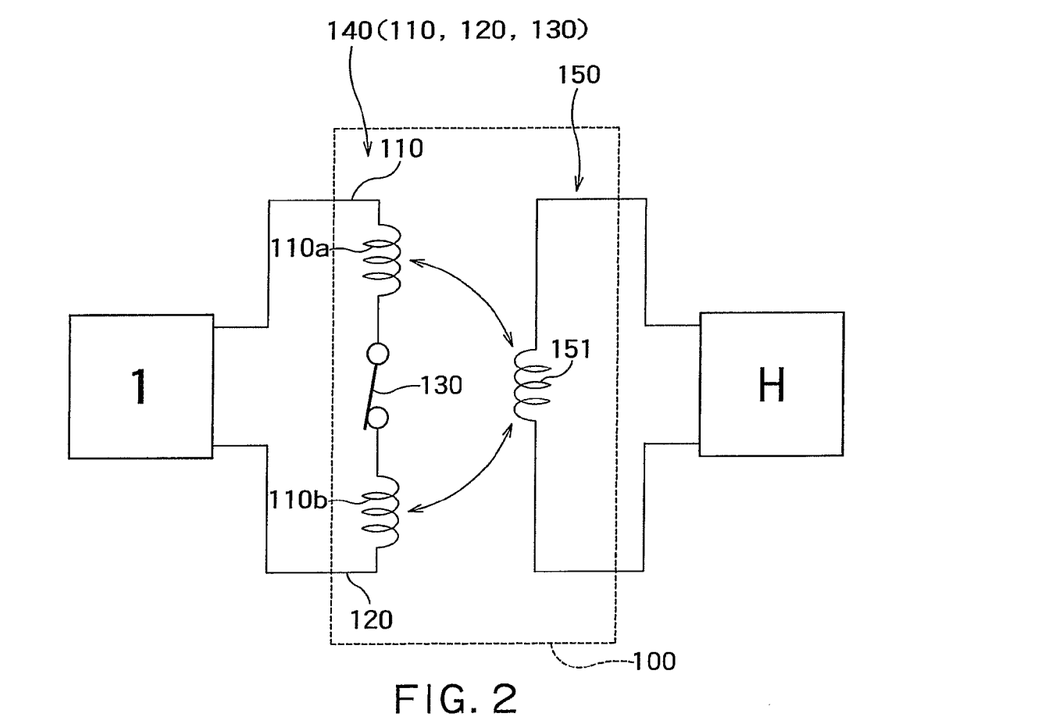
FIG. 2 shows a structural example of a high-frequency switching circuit according to a first embodiment.

FIG. 2 shows a structural example of a high-frequency switching circuit according to the first embodiment (when N is 1).

A high-frequency switching circuit 100 of FIG. 2 performs control to switch the connection and disconnection between the high-frequency circuits 1 and H.

The high-frequency switching circuit 100 includes a first differential line 140 and a third line 150.

The first differential line 140 includes a first line 110, a second line 120, and a switch (first switch) 130.

The first line 110 has one end and the other end. The first line 110 includes an inductor pattern (first inductor) 110a.

The second line 120 has one end and the other end. The second line 120 includes an inductor pattern (second inductor) 110b.

One end of the first line 110 and one end of the second line are connected to connection terminals (drain terminal and source terminal) of the switch 130. The switch 130 is a MOS (metal-oxide-semiconductor) transistor formed on a substrate such as a semiconductor substrate. The switch 130 is called MOS switch.

On/off control (gate voltage control) of the switch 130 is performed to switch the electrical connection between the first line 110 and the second line 120. The on/off control of the switch 130 is performed by a control circuit.

The other ends of the first line 110 and the second line 120 are connected to differential terminals of the high-frequency circuit 1.

When the switch 130 is turned on, the pair of inductors 110a and 110b form a differential inductor.

The third line 150 has one end and the other end connected to the high-frequency circuit H. Further, the third line 150 includes an inductor pattern (third inductor) 151 as a differential inductor.

The third line 150 is magnetically coupled with the first differential line 140 when the switch 130 is turned on.

When the switch 130 is turned on, the first differential line 140 forms a loop with the high-frequency circuit 1, and forms a magnetic coupling with the third line 150.

In operation, the other ends of the first and second lines are inputted with differential signals supplied by the high-frequency circuit 1. The inputted differential signals are transmitted to the third line 150 through the electromagnetic coupling between the inductors 110a and 110b and the third line 150, and are inputted into the high-frequency circuit H.

Alternatively, the first differential line 140 receives differential signals from the high-frequency circuit H through the electromagnetic coupling with the third line 150, and outputs the received differential signals to the high-frequency circuit 1 from the other ends of the first and second lines.

When the switch 130 is turned off, the first differential line 140 does not form a loop, and is not magnetically coupled with the third line 150.

In the example shown in FIG. 2, the third line 150 includes a differential inductor, but the third line 150 may include a single-phase inductor. In this case, the single-phase inductor can be obtained by connecting one side between the third line 150 and the circuit H to the ground, for example. This can be similarly applied to the other embodiments to be explained later.

Figure 3:
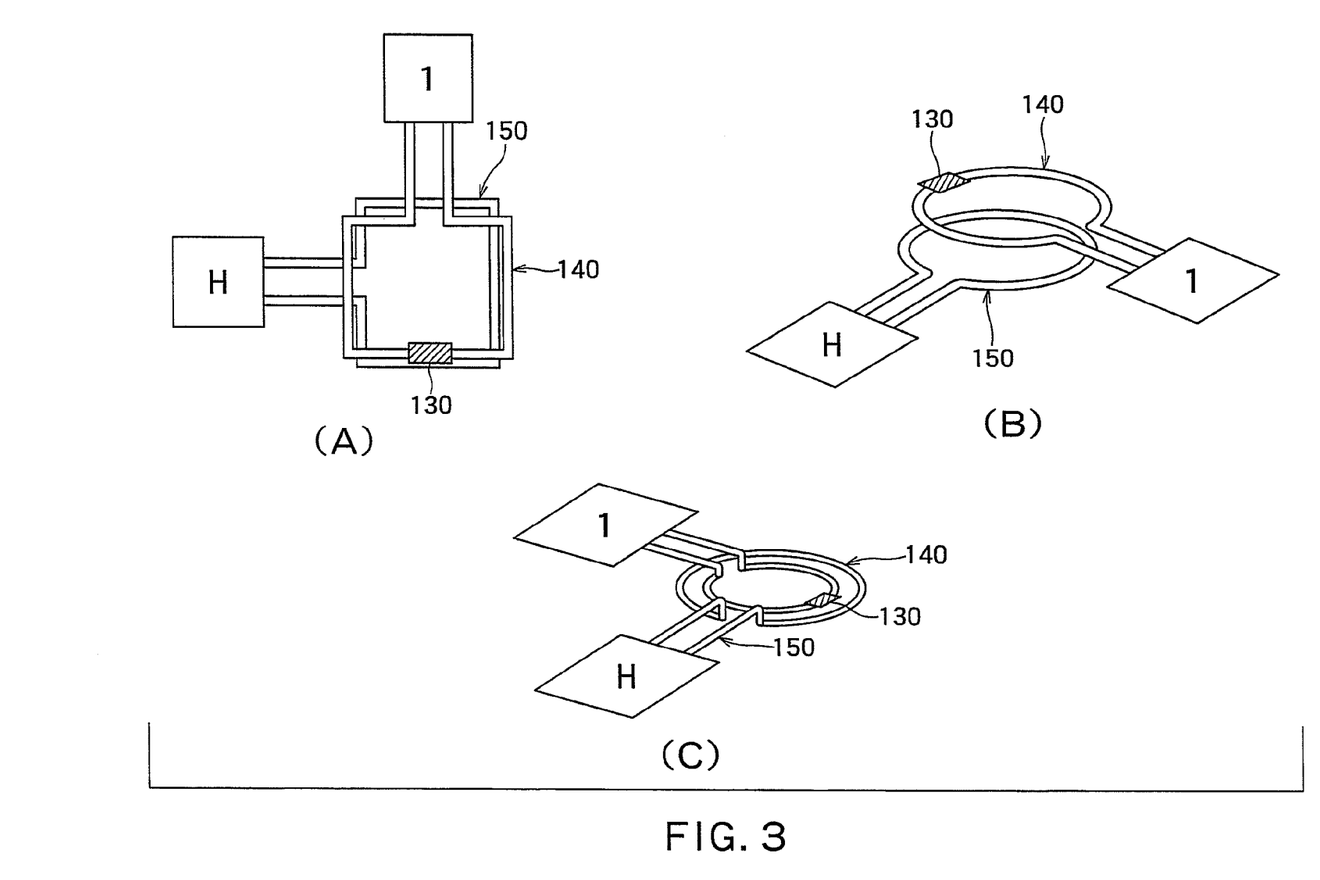
FIG. 3 shows layout examples of the high-frequency switching circuit of FIG. 2.

FIG. 3(A) to FIG. 3(C) show layout examples of the high-frequency switching circuit 100 of FIG. 2.

In the layout examples of FIG. 3(A) and FIG. 3(B), the first differential line 140 and the third line 150 are formed using two layers in a substrate such as a semiconductor substrate.

In the layout example of FIG. 3(C), the first differential line 140 and the third line 150 are formed using one layer in a substrate excepting the portions crossing each other.

As stated above, the first differential line and the third line can be laid out with a high degree of freedom, and thus circuit area can be reduced by the present embodiment.

Here, the switch 130 is characterized by being arranged at a position where the electrical length from the other end of the first line 110 and the electrical length from the other end of the second line 120 are exactly or approximately equal in the first differential line 140.

The position where the electrical distances from both ends (the other ends of the first and second lines) of the first differential line 140 are equal serves as a common mode node, at which the amplitude of an alternating current signal (AC signal) becomes extremely small.

By arranging the switch 130 at this common mode node, the amplitude of the AC voltage at both poles of the switch 130 becomes extremely small, and thus signal loss due to the parasitic capacitance of the switch 130 can be greatly restrained.

Therefore, the gate width of the switch 130 can be increased while restraining the signal loss due to parasitic capacitance, which makes it possible to reduce the on-resistance of the switch 130.

As stated above, in the present embodiment, by arranging the switch 130 at the common mode node of the differential line, the on-resistance of the switch 130 can be reduced while restraining the signal loss due to parasitic capacitance.

Further, the differential lines and the third line can be laid out with a high degree of freedom, and thus circuit area can be reduced.

In the example shown in FIG. 2, the first differential line 140 includes the first line 110, the second line 120, and the first switch 130, but a single-phase line without the second line 120 may be used instead. In this case, the terminal on one side of the first switch 130 is grounded. By arranging the switch 130 at a node near the ground, the amplitude of the AC voltage at both poles of the switch 130 becomes extremely small, and thus signal loss due to the parasitic capacitance of the switch 130 can be greatly restrained.

Second Embodiment

The first embodiment shows a high-frequency switching circuit when N is 1. In the present embodiment, a high-frequency switching circuit when N is 2 will be explained.

Figure 4:
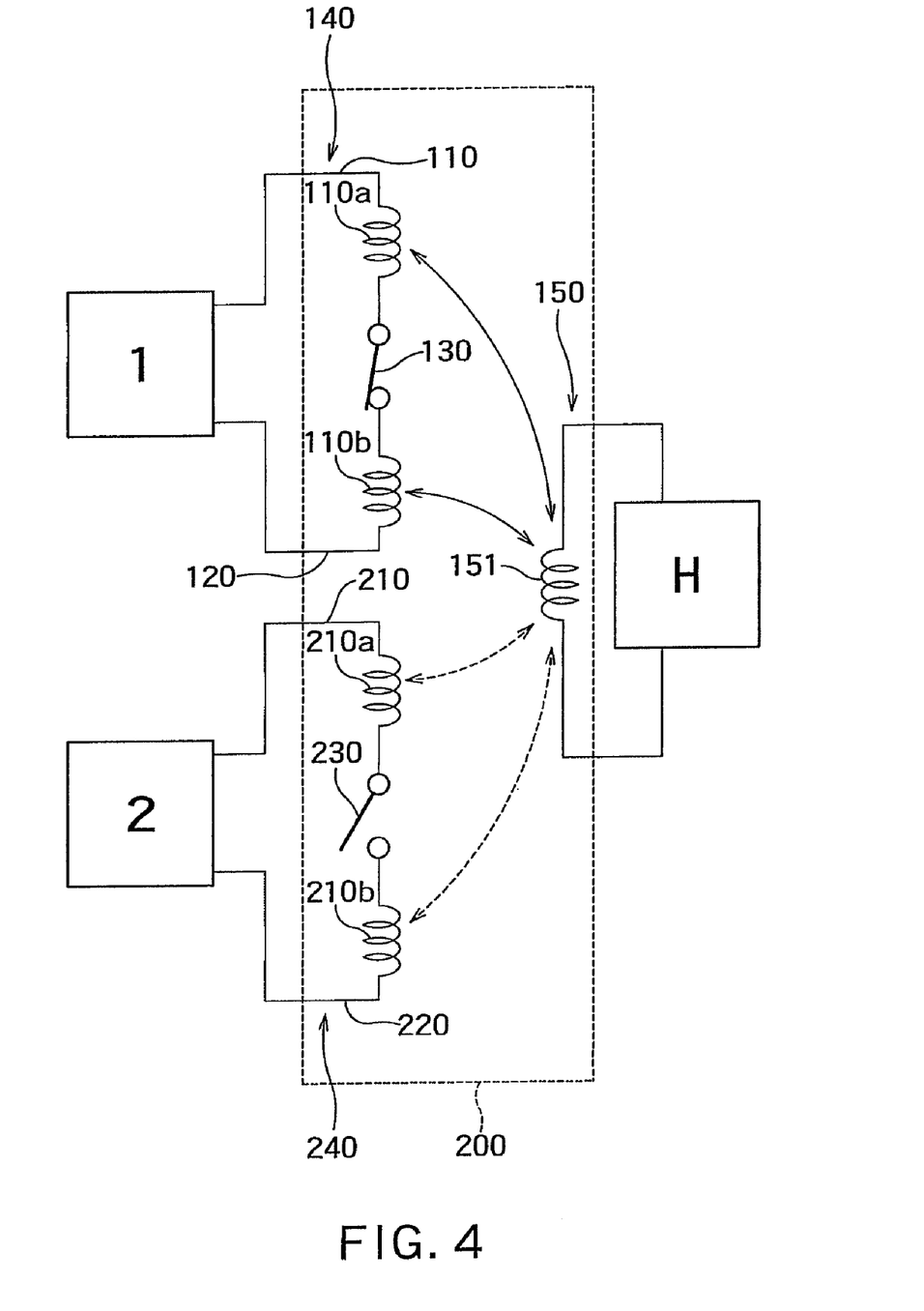
FIG. 4 shows a high-frequency switching circuit according to a second embodiment.

FIG. 4 shows a high-frequency switching circuit according to the second embodiment. Components similar to those of FIG. 2 are attached with the same symbols.

In the block diagram of FIG. 4, a second differential line 240 and a high-frequency circuit 2 are additionally arranged.

The second differential line 240 is formed similarly to the first differential line 140.

That is, the second differential line 240 includes a fourth line 210, a fifth line 220, and a switch (second switch) 230.

The fourth line 210 has one end and the other end. The fourth line 210 includes an inductor pattern (fourth inductor) 210a.

The fifth line 220 has one end and the other end. The fifth line 220 includes an inductor pattern (fifth inductor) 210b.

The other ends of the fourth line 210 and the fifth line 220 are connected to differential terminals of the high-frequency circuit 2.

The switch 230 switches the electrical connection between one ends of the fourth line 210 and the fifth line 220.

When the switch 230 is turned on, the second differential line 240 forms a loop with the high-frequency circuit 2, and the second differential line 240 and the third line are electromagnetically coupled with each other.

In operation, the other ends of the fourth and fifth lines are inputted with differential signals supplied by the high-frequency circuit 2. The inputted differential signals are transmitted to the third line 150 through the electromagnetic coupling between the inductors 210a and 210b and the third line 150, and are inputted into the high-frequency circuit H.

Alternatively, the second differential line 240 receives differential signals from the high-frequency circuit H through the electromagnetic coupling with the third line 150, and supplies the received differential signals to the high-frequency circuit 2 from the other ends of the fourth and fifth lines.

When the switch 230 is turned off, the second differential line 240 does not form a loop, and is not magnetically coupled with the third line 150.

Note that the switch 230 and the switch 130 are controlled by the high-frequency switching circuit so that one is turned on and the other is turned off.

The third line 150 is electromagnetically coupled with the differential line having a switch which is turned on, which realizes the communication between the high-frequency circuit H and the high-frequency circuit connected to the differential line having a switch which is turned on.

Similarly to the first embodiment, the switch 230 is arranged at a position where the electrical length from the other end of the fourth line 210 and the electrical length from the other end of the fifth line 220 are exactly or approximately equal in the second differential line 240.

Therefore, in operation, the amplitude of the AC signal at both poles of the switch 230 becomes extremely small, and thus signal loss due to the parasitic capacitance of the switch 230 can be greatly restrained.

Accordingly, the gate width of the switch 230 can be increased while restraining the signal loss due to parasitic capacitance, which makes it possible to reduce the on-resistance of the switch 230.

Figure 5:
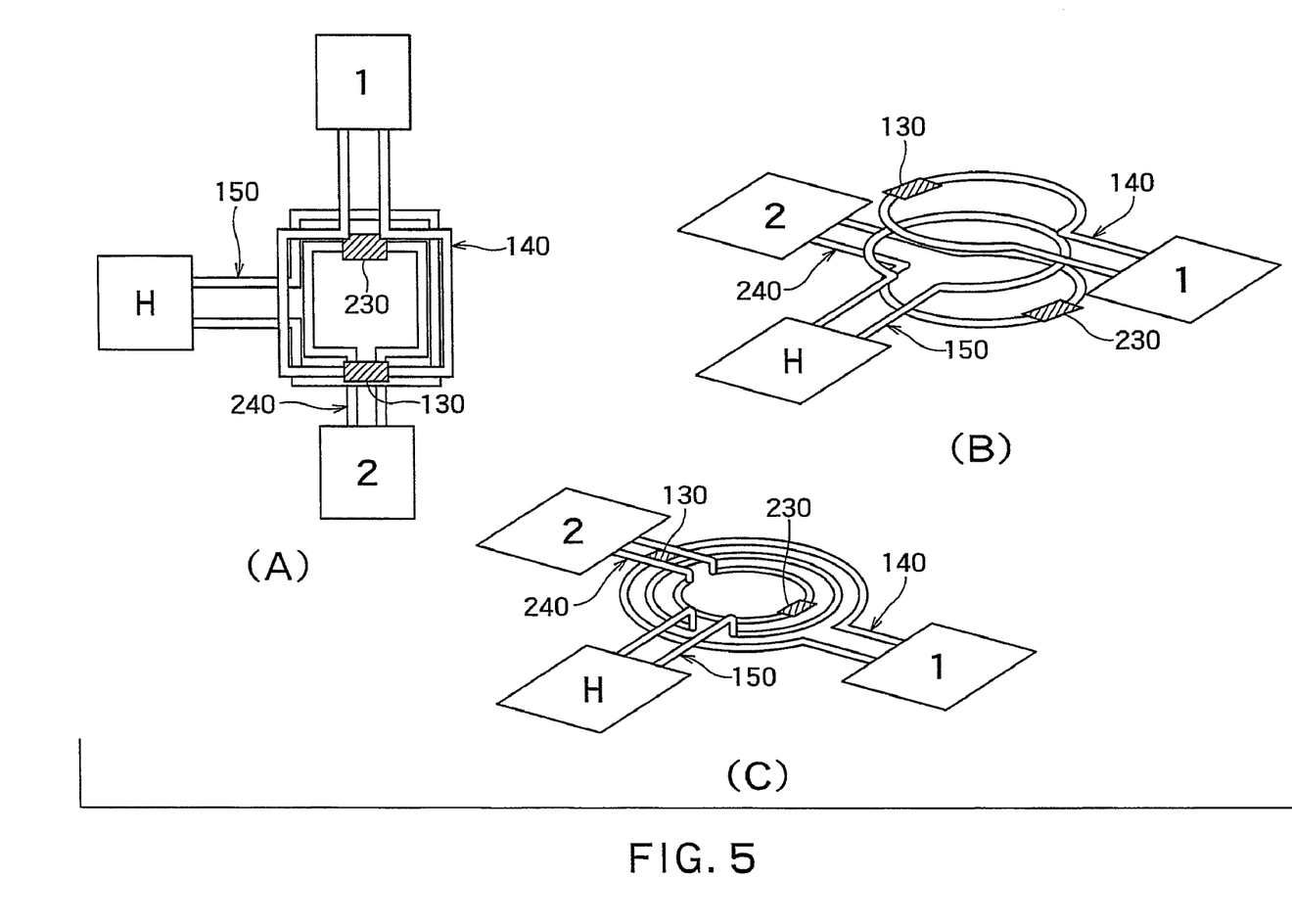
FIG. 5 shows layout examples of the high-frequency switching circuit of FIG. 4.

FIG. 5(A) to FIG. 5(C) show layout examples of the high-frequency switching circuit 200 of FIG. 4.

In the layout examples of FIG. 5(A) and FIG. 5(B), the first differential line 140, the second differential line 240, and the third line 150 are formed using three layers in a substrate such as a semiconductor substrate.

In the layout example of FIG. 5(C), the first differential line 140, the second differential line 240, and the third line 150 are formed using two layers in a substrate excepting the portions crossing each other.

As stated above, the first differential line, the second differential line, and the third line can be laid out with a high degree of freedom, and thus circuit area can be reduced by the present embodiment.

Figure 6:
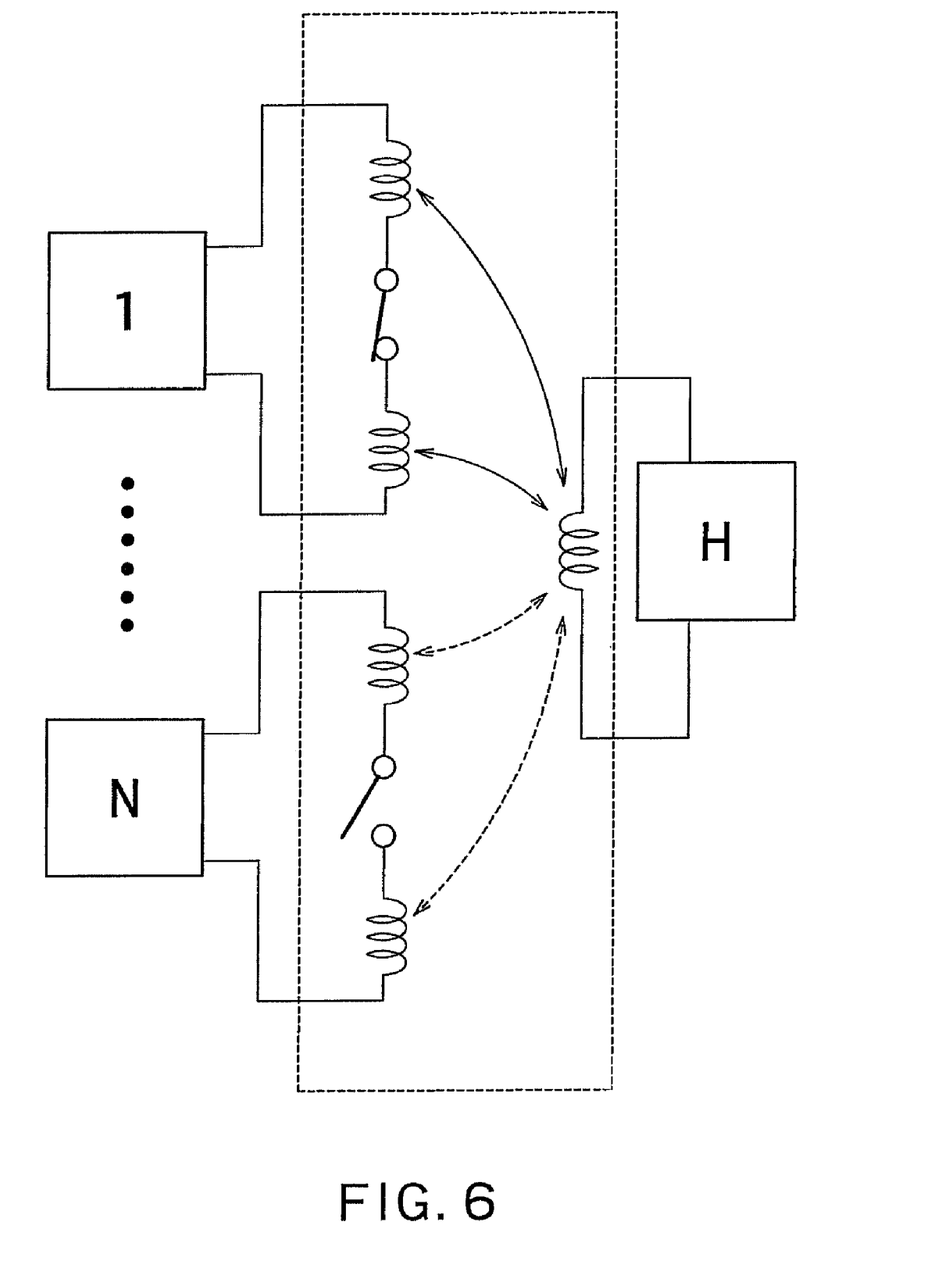
FIG. 6 shows another structural example of the high-frequency switching circuit.

The present embodiment shows an example when N is 2, but the high-frequency switching circuit can be similarly formed when N is 3 or greater, as shown in FIG. 6. The structure and operation in this case is obvious from the example when N is 2, and thus the explanation thereof will be omitted.

As stated above, in the present embodiment, by arranging the switch at the common mode node of the differential line, the on-resistance of the switch can be reduced while restraining the signal loss due to parasitic capacitance.

Third Embodiment

Figure 7:
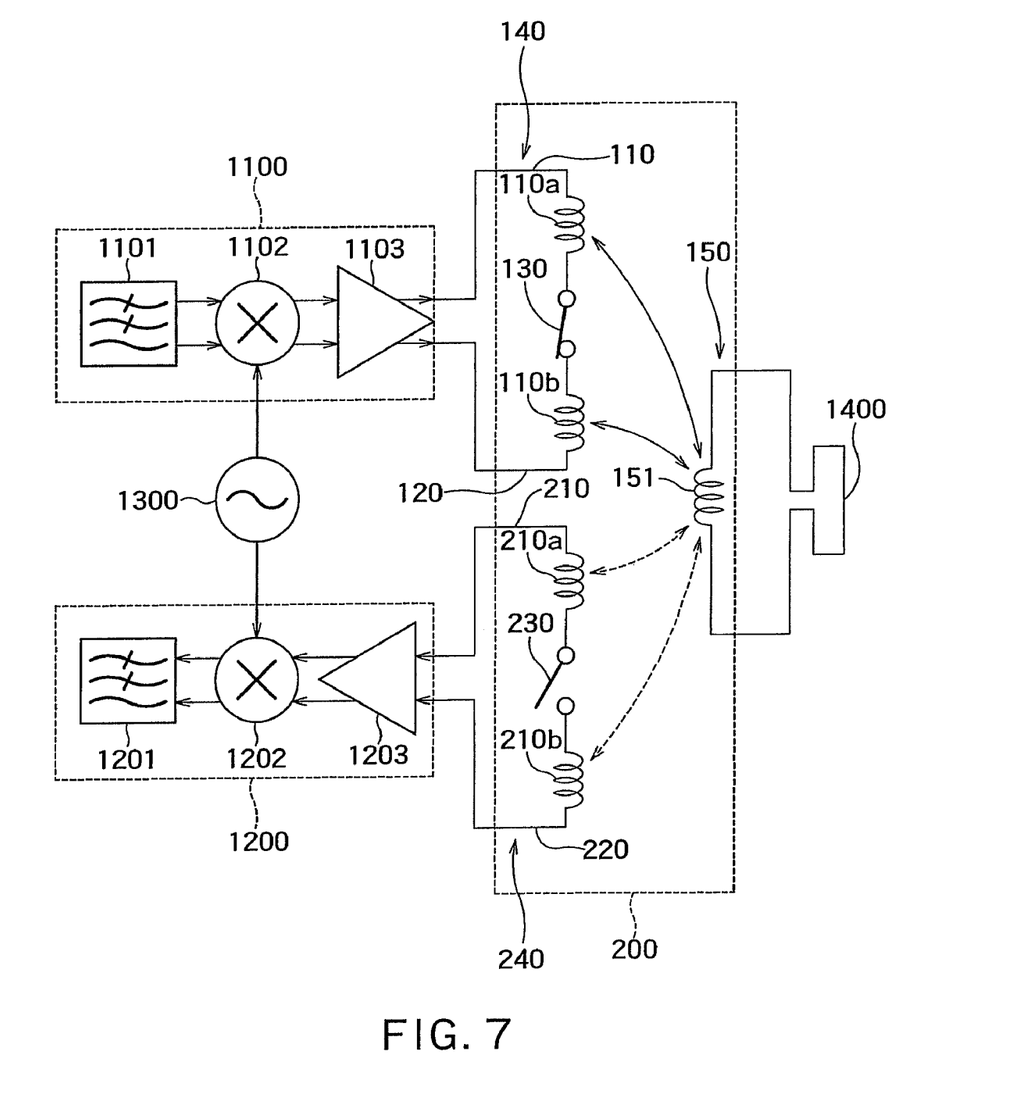
FIG. 7 shows a radio communication device according to a third embodiment.

FIG. 7 shows a radio communication device according to the third embodiment.

This radio communication device includes: the high-frequency switching circuit 200 of FIG. 4 according to the second embodiment; a transmitter front-end circuit 1100; a receiver front-end circuit 1200; a oscillator circuit 1300; and a loop antenna 1400.

The transmitter front-end circuit 1100 corresponds to the high-frequency circuit 1 of FIG. 4. The receiver front-end circuit 1200 corresponds to the high-frequency circuit 2. Further, the loop antenna 1400 corresponds to the high-frequency circuit H.

The transmitter front-end circuit 1100 includes: a lowpass filter 1101; a mixer 1102; and a differential power amplifier (first amplifier) 1103.

The differential output terminals of the differential power amplifier 1103 are connected to both ends of the differential line 140 (that is, the other end of the first line 110 and the other end of the second line 120).

The mixer 1102 up-converts the signals passed through the lowpass filter 1101 by using local signals generated by the oscillator circuit 1300.

The power amplifier 1103 amplifies the up-converted signals and outputs the amplified differential signals.

The receiver front-end circuit 1200 includes: a low noise amplifier (second amplifier) 1203; a mixer 1202; and a lowpass filter 1201.

The differential input terminals of the low noise amplifier 1203 are connected to both ends (that is, the other end of the fourth line 210 and the other end of the fifth line 220) of the differential line 240.

The mixer 1202 down-converts the signals amplified by the low noise amplifier 1203 by using the local signals generated by the oscillator circuit 1300.

The down-converted signals are inputted into the lowpass filter 1201, and successively undergo analog-digital conversion, decoding and demodulation processes, etc.

In the device of FIG. 7, a transmitting mode and a receiving mode can be switched by turning on one of the switches 130 and 230 while turning off the other.

In the transmitting mode, the switch 130 is turned on, and the switch 230 is turned off.

In the transmitting mode, the transmitter front-end circuit 1100 performs a transmitting process to generate transmission signals (differential signals). The generated transmission signals are inputted into both ends of the differential line 140.

The inputted signals are transmitted to the third line 150 through the electromagnetic coupling between the inductors 110a and 110b in the differential line 140 and the third line 150. In this case, signal loss due to the parasitic capacitance of the switch 130 can be greatly restrained.

The signals transmitted to the third line 150 are inputted into the loop antenna 1400 to be emitted into space as radio waves.

In the receiving mode, the switch 130 is turned off, and the switch 230 is turned on.

In the receiving mode, high frequency signals received by the loop antenna 1400 are supplied to the third line 150 as analog received signals.

The signals supplied to the third line 150 are transmitted to the differential line 240 through the electromagnetic coupling between the third line 150 and the inductors 210a and 210b in the second differential line 240. In this case, signal loss due to the parasitic capacitance of the switch 230 can be greatly restrained.

The received signals transmitted to the differential line 240 are inputted into the receiver front-end circuit 1200, and undergo a receiving process.

In the example of FIG. 7, the loop antenna 1400 is used as the high-frequency circuit H, but another antenna such as dipole antenna, L-shaped antenna, etc. can be used. A single-phase inductor may be used instead of the differential inductor included in the third line 150 depending on the antenna to be used.

Fourth Embodiment

Figure 8:
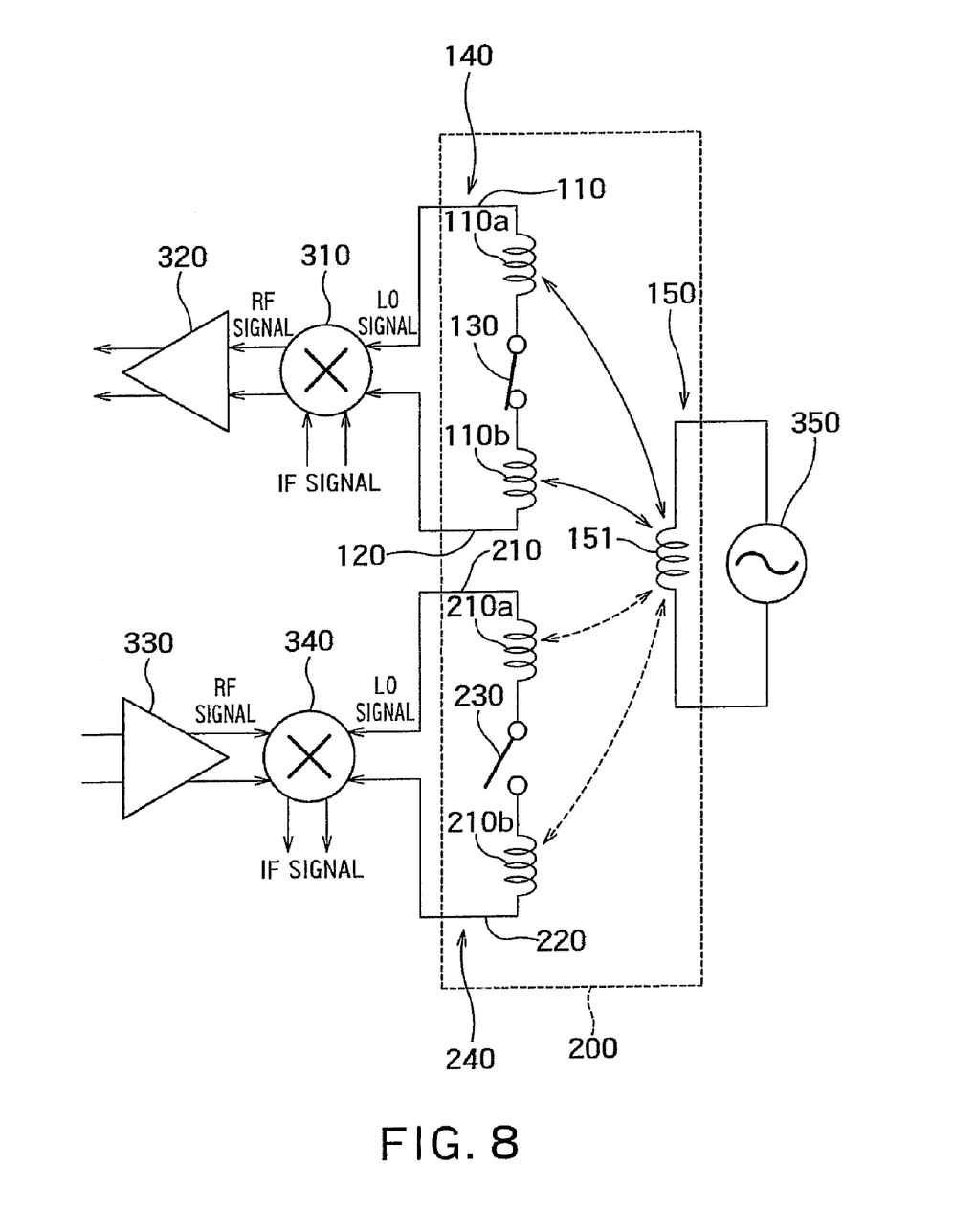
FIG. 8 shows a radio communication device according to a fourth embodiment.

FIG. 8 shows a radio communication device according to the fourth embodiment.

This radio communication device includes: the high-frequency switching circuit 200 in the second embodiment; an up-conversion mixer circuit 310; a power amplifier 320; a low noise amplifier 330; a down-conversion mixer circuit 340; and an oscillator circuit 350.

The up-conversion mixer circuit 310 corresponds to the high-frequency circuit 1 of FIG. 4. The down-conversion mixer circuit 340 corresponds to the high-frequency circuit 2. Further, the oscillator circuit 350 corresponds to the high-frequency circuit H.

By turning on one of the switches 130 and 230 while turning off the other, the transmission destination of local signals (LO signals) generated by the oscillator circuit 350 is switched between the up-conversion mixer circuit 310 and the down-conversion mixer circuit 340.

In the transmitting mode, the switch 130 is turned on, and the switch 230 is turned off.

In the transmitting mode, the local signals generated by the oscillator circuit 350 are supplied to the third line 150. The signals supplied to the third line 150 are transmitted to the differential line 140 through the electromagnetic coupling between the third line 150 and the inductors 110a and 110b in the first differential line 140. In this case, signal loss due to the parasitic capacitance of the switch 130 can be greatly restrained.

The local signals transmitted to the differential line 140 are inputted into the up-conversion mixer circuit 310 and mixed with intermediate-frequency (IF) transmission signals separately inputted into the up-conversion mixer circuit 310. In this way, radio-frequency (RF) transmission signals are obtained. The RF signals are amplified by the power amplifier 320, and transmitted through an antenna (not shown).

In the receiving mode, the switch 130 is turned off, and the switch 230 is turned on.

In the receiving mode, the local signals generated by the oscillator circuit 350 are supplied to the third line 150.

The signals supplied to the third line 150 are transmitted to the differential line 240 through the electromagnetic coupling between the third line 150 and the inductors 210a and 210b in the second differential line 240. In this case, signal loss due to the parasitic capacitance of the switch 230 can be greatly restrained.

The local signals transmitted to the differential line 240 are inputted into the down-conversion mixer circuit 340 and mixed with radio-frequency (RF) received signals outputted by the low noise amplifier 330. In this way, intermediate-frequency (IF) received signals are generated.

The generated received signals successively undergo low-pass filter process, analog-digital conversion process, demodulation process, etc.

Fifth Embodiment

Figure 9:
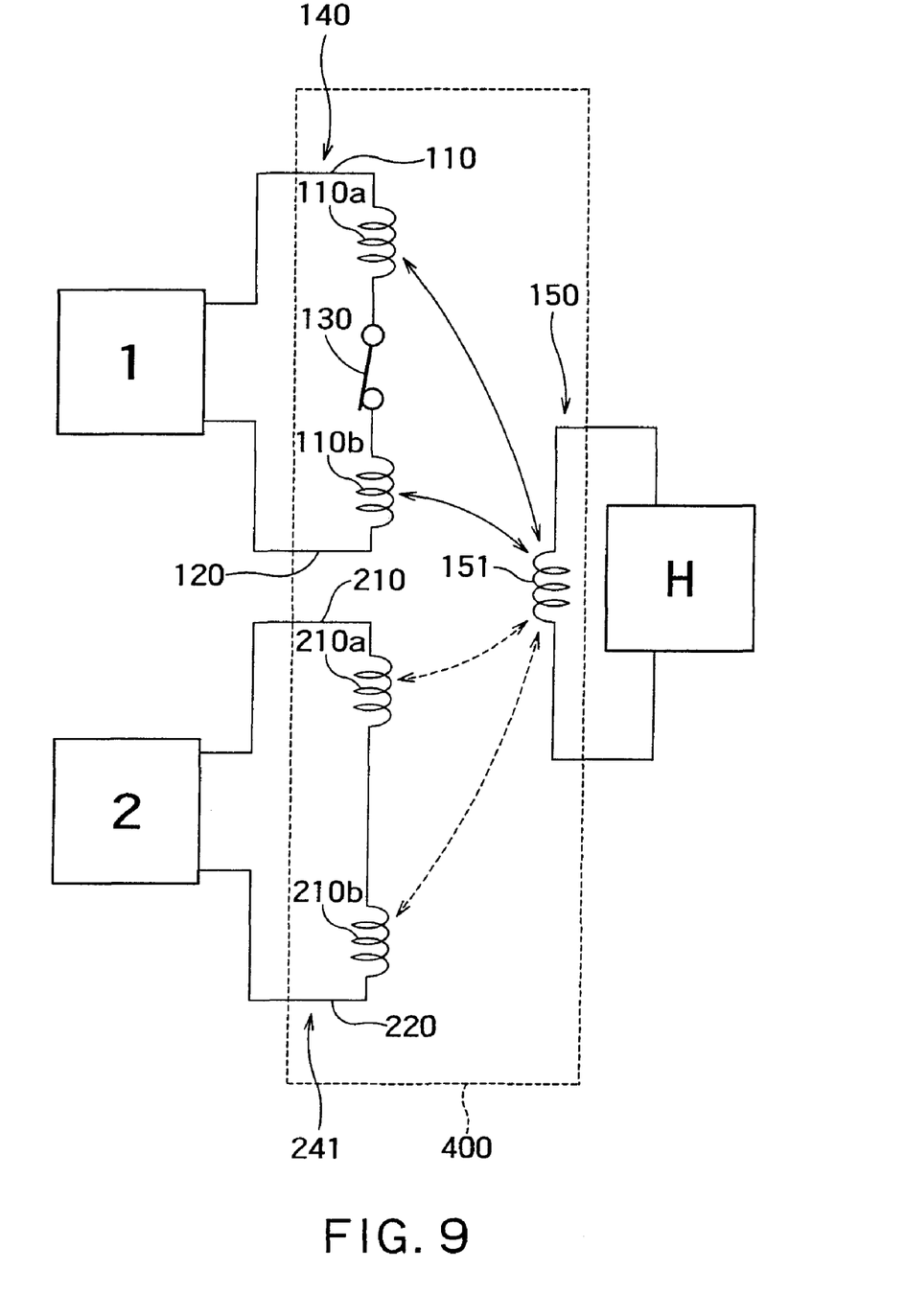
FIG. 9 shows a high-frequency switching circuit according to a fifth embodiment.

FIG. 9 shows a high-frequency switching circuit according to the fifth embodiment. Components similar to those of FIG. 4 are attached with the same symbols.

In the present embodiment, the high-frequency circuit 1 has a first differential circuit having a transmitting function, the high-frequency circuit 2 has a second differential circuit having a receiving function, and the high-frequency circuit H has an antenna function.

The present embodiment is greatly different from the second embodiment in that one end of the fourth line 210 and one end of the fifth line 220 are directly connected to each other and a switch is not arranged in the middle of a second differential line 241.

In this case, it is required to prevent signal power from leaking from the first differential line 140 to the second differential line 241 when the switch 130 is turned on.

Accordingly, the first differential line 140 and the second differential line 241 are laid out so that the magnetic coupling between the first differential line 140 and the second differential line 241 is weakened (that is, so that the magnetic coupling between the inductors 110a and 110b and the inductors 210a and 210b is weakened).

In this way, signal power transmitted from the first differential line 140 to the third line 150 when the switch 130 is turned on can be sufficiently prevented from leaking to the second differential line 241.

On the other hand, when the switch 130 is turned off, the first differential line 140 does not form a loop, and is not magnetically coupled with the third line 150. Accordingly, the analog received signals received by the antenna H and transmitted to the third line 150 are wholly transmitted to the high-frequency circuit 2 (receiving function) through the magnetic coupling between the third line 150 and the second differential line 241.

As stated above, in the present embodiment, the switch of at least one of a plurality of differential lines can be omitted. Accordingly, signal loss can be surely reduced in the differential line from which the switch is omitted. Further, circuit area can be reduced by omitting the switch.

Embodiments of the present invention is not limited to the exact embodiments described above and can be embodied with its components modified in an implementation phase without departing from the scope of the invention. Also, arbitrary combinations of the components disclosed in the above-described embodiments can form various inventions. For example, some of the all components shown in the embodiments may be omitted. Furthermore, components from different embodiments may be combined as appropriate.

The invention claimed is:

1. A high-frequency switching circuit comprising:
a first differential line which
includes a first line configured to have one end and an other end, a second line configured to have one end and an other end and a first switch configured to switch electrical connection between the one ends of the first and second lines, the other ends of the first and second lines receiving or outputting differential signals; and
a third line configured to be electromagnetically coupled with the first differential line when the first switch is turned on,
wherein the first switch is arranged at a position where an electrical length from the other end of the first line and an electrical length from the other end of the second line are approximately equal.

2. The circuit of claim 1, further comprising:
a second differential line which
includes a fourth line configured to have one end and an other end, a fifth line configured to have one end and an other end and a second switch configured to switch electrical connection between the one ends of the fourth and fifth lines, the other ends of the fourth and fifth lines receiving or outputting differential signals,
wherein the third line is electromagnetically coupled with the second differential line when the second switch is turned on, and
wherein the second switch is arranged at a position where an electrical length from the other end of the fourth line and an electrical length from the other end of the fifth line are approximately equal.

3. A radio communication device comprising:
the circuit of claim 2;
an antenna connected to the third line;
a transmitter including a first amplifier connected to the other ends of the first and the second lines;
a receiver including a second amplifier connected to the other ends of the fourth and the fifth lines;
wherein the circuit turns on the first switch and turns off the second switch in a transmitting mode and turns off the first switch and turns on the second switch in a receiving mode,
the first amplifier amplifies and supplies to the other ends of the first and the second lines a transmission signal in the transmitting mode, and
the second amplifier amplifies a signal supplied from the other ends of the fourth and the fifth lines in the receiving mode.

4. A high-frequency switching circuit comprising:
a first differential line which
includes a first inductor configured to have one end and an other end, a second inductor configured to have one end and an other end and a first switch configured to switch electrical connection between the one ends of the first and second inductors, the other ends of the first and second inductors receiving or outputting differential signals; and a line including a third inductor configured to be electromagnetically coupled with the first differential line when the first switch is turned on, wherein the first switch is arranged at a position where an electrical length from the other end of the first inductor and an electrical length from the other end of the second inductor are approximately equal.

5. The circuit of claim 1, further comprising:

a second differential line which
includes a fourth inductor configured to have one end and an other end, a fifth inductor configured to have one end and an other end and a second switch configured to switch electrical connection between the one ends of the fourth and fifth inductors, the other ends of the fourth and fifth inductors receiving or outputting differential signals, wherein the third inductor is electromagnetically coupled with the second differential line when the second switch is turned on, and wherein the second switch is arranged at a position where an electrical length from the other end of the fourth inductor and an electrical length from the other end of the fifth inductor are approximately equal.

6. A radio communication device comprising:

the circuit of claim 5;

an antenna connected to the line;

a transmitter including a first amplifier connected to the other ends of the first and the second inductors;

a receiver including a second amplifier connected to the other ends of the fourth and the fifth inductors;

wherein the circuit turns on the first switch and turns off the second switch in a transmitting mode and turns off the first switch and turns on the second switch in a receiving mode, the first amplifier amplifies and supplies a transmission signal to the other ends of the first and the second inductors in the transmitting mode, and the second amplifier amplifies a signal supplied from the other ends of the fourth and the fifth inductors in the receiving mode.

* * * * *